United States Patent
Weng et al.

(10) Patent No.: US 12,074,025 B2
(45) Date of Patent: Aug. 27, 2024

(54) PHOTORESIST DEVELOPER AND METHOD OF DEVELOPING PHOTORESIST

(71) Applicant: TAIWAN SEMICONDUCTOR MANUFACTURING COMPANY, LTD., Hsinchu (TW)

(72) Inventors: Ming-Hui Weng, New Taipei (TW); An-Ren Zi, Hsinchu (TW); Ching-Yu Chang, Yuansun Village (TW); Chen-Yu Liu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/197,640

(22) Filed: May 15, 2023

(65) Prior Publication Data

US 2023/0282477 A1 Sep. 7, 2023

Related U.S. Application Data

(63) Continuation of application No. 17/019,094, filed on Sep. 11, 2020, now Pat. No. 11,694,896.

(Continued)

(51) Int. Cl.
*H01L 21/027* (2006.01)
*G03F 7/00* (2006.01)
*G03F 7/11* (2006.01)

(52) U.S. Cl.
CPC ........ *H01L 21/0271* (2013.01); *G03F 7/0025* (2013.01); *G03F 7/11* (2013.01)

(58) Field of Classification Search
CPC ............ H01L 21/0271; H01L 21/0274; G03F 7/0025; G03F 7/11; G03F 7/325;
(Continued)

(56) References Cited

U.S. PATENT DOCUMENTS

| 8,796,666 B1 | 8/2014 | Huang et al. |
| 9,012,132 B2 | 4/2015 | Chang |

(Continued)

FOREIGN PATENT DOCUMENTS

| JP | 2003-330204 A | 11/2003 |
| JP | 2016-75853 A | 5/2016 |

(Continued)

OTHER PUBLICATIONS

Takahiro Kozawa and Seiichi Tagawa, "Radiation Chemistry in Chemically Amplified Resists," Japanese Journal of Applied Physics, vol. 49, 030001, pp. 1-19, 2010.

(Continued)

*Primary Examiner* — Caleen O Sullivan

(74) *Attorney, Agent, or Firm* — STUDEBAKER & BRACKETT PC

(57) ABSTRACT

A method of forming a pattern in a photoresist includes forming a photoresist layer over a substrate, and selectively exposing the photoresist layer to actinic radiation to form a latent pattern. The latent pattern is developed by applying a developer composition to the selectively exposed photoresist layer to form a pattern. The developer composition includes a first solvent having Hansen solubility parameters of $15<\delta_d<25$, $10<\delta_p<25$, and $6<\delta_h<30$; an acid having an acid dissociation constant, pKa, of $-15<pKa<5$, or a base having a pKa of $40>pKa>9.5$; and a second solvent having a dielectric constant greater than 18. The first solvent and the second solvent are different solvents.

20 Claims, 9 Drawing Sheets

Related U.S. Application Data

(60) Provisional application No. 62/928,952, filed on Oct. 31, 2019.

(58) Field of Classification Search
CPC ........... G03F 7/32; G03F 7/322; G03F 7/038; G03F 7/16; G03F 7/20
USPC .................................. 430/5, 311, 313, 327
See application file for complete search history.

(56) References Cited

U.S. PATENT DOCUMENTS

| | | |
|---|---|---|
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 10,866,511 B2 | 12/2020 | Zi et al. |
| 11,300,878 B2 | 4/2022 | Zi et al. |
| 11,694,896 B2 * | 7/2023 | Weng .................... G03F 7/11 430/5 |
| 2005/0026091 A1 | 2/2005 | Nagase |
| 2008/0160452 A1 | 7/2008 | Takahashi |
| 2013/0296214 A1 | 11/2013 | Barnes et al. |
| 2014/0272724 A1 | 9/2014 | Wang et al. |
| 2015/0192851 A1 | 7/2015 | Yamashita et al. |
| 2016/0342091 A1 | 11/2016 | Lin |
| 2018/0040474 A1 | 2/2018 | Zi et al. |
| 2019/0146337 A1 | 5/2019 | Zi et al. |

FOREIGN PATENT DOCUMENTS

| | | |
|---|---|---|
| KR | 10-2004-0043620 A | 5/2004 |
| TW | 201815487 A | 5/2018 |
| TW | 201918803 A | 5/2019 |
| WO | 9301527 | 1/1993 |

OTHER PUBLICATIONS

Non-Final Office Action Issued in U.S. Appl. No. 15/938,599, dated Oct. 4, 2019.
Final Office Action issued in U.S. Appl. No. 15/938,599, dated Apr. 16, 2020.
Non-Final Office Action issued in U.S. Appl. No. 15/938,599, dated Sep. 18, 2020.
Final Office Action issued in U.S. Appl. No. 15/938,599, dated Mar. 25, 2021.
Non-Final Office Action issued in U.S. Appl. No. 15/938,599, dated Aug. 19, 2021.
Notice of Allowance issued in U.S. Appl. No. 15/938,599, dated Dec. 8, 2021.
Non-Final Office Action issued in U.S. Appl. No. 17/019,094 dated Oct. 6, 2022.
Notice of Allowance issued in U.S. Appl. No. 17/019,094 dated Feb. 14, 2023.

* cited by examiner

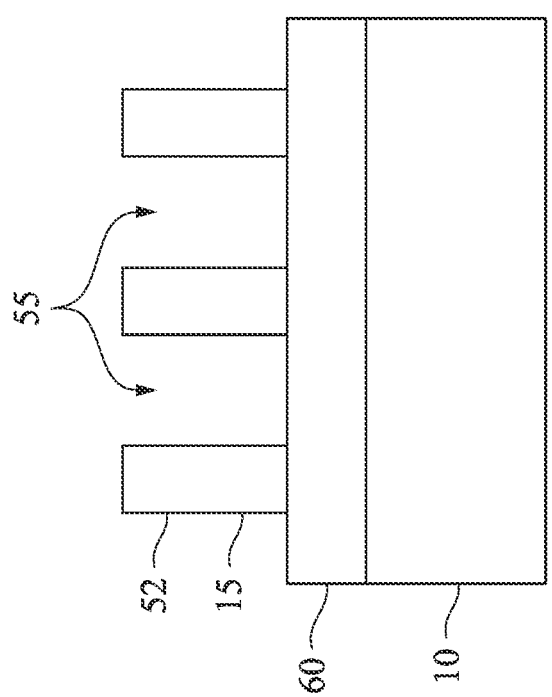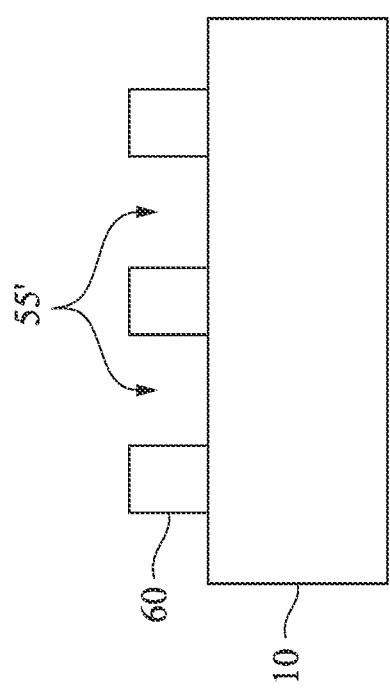

PHOTORESIST DEVELOPER AND METHOD OF DEVELOPING PHOTORESIST

RELATED APPLICATIONS

This application is a continuation application of U.S. application Ser. No. 17/019,094, filed Sep. 11, 2020, which claims priority to U.S. Provisional Patent Application No. 62/928,952 filed Oct. 31, 2019, the entire contents of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-verse.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10 shows a process stage of a sequential operation according to an embodiment of the disclosure.

FIG. 11 shows a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Resist scum and residue remaining in the patterned areas of the photoresist layer after development causes increased line width roughness and line etch roughness. The scum and residue causes defects in photoresist patterns and results in decreased semiconductor device yield. Embodiments of the present disclosure address these issues, and reduce the amount of scum and residue or substantially eliminate scum and residue after development.

Figure 1:
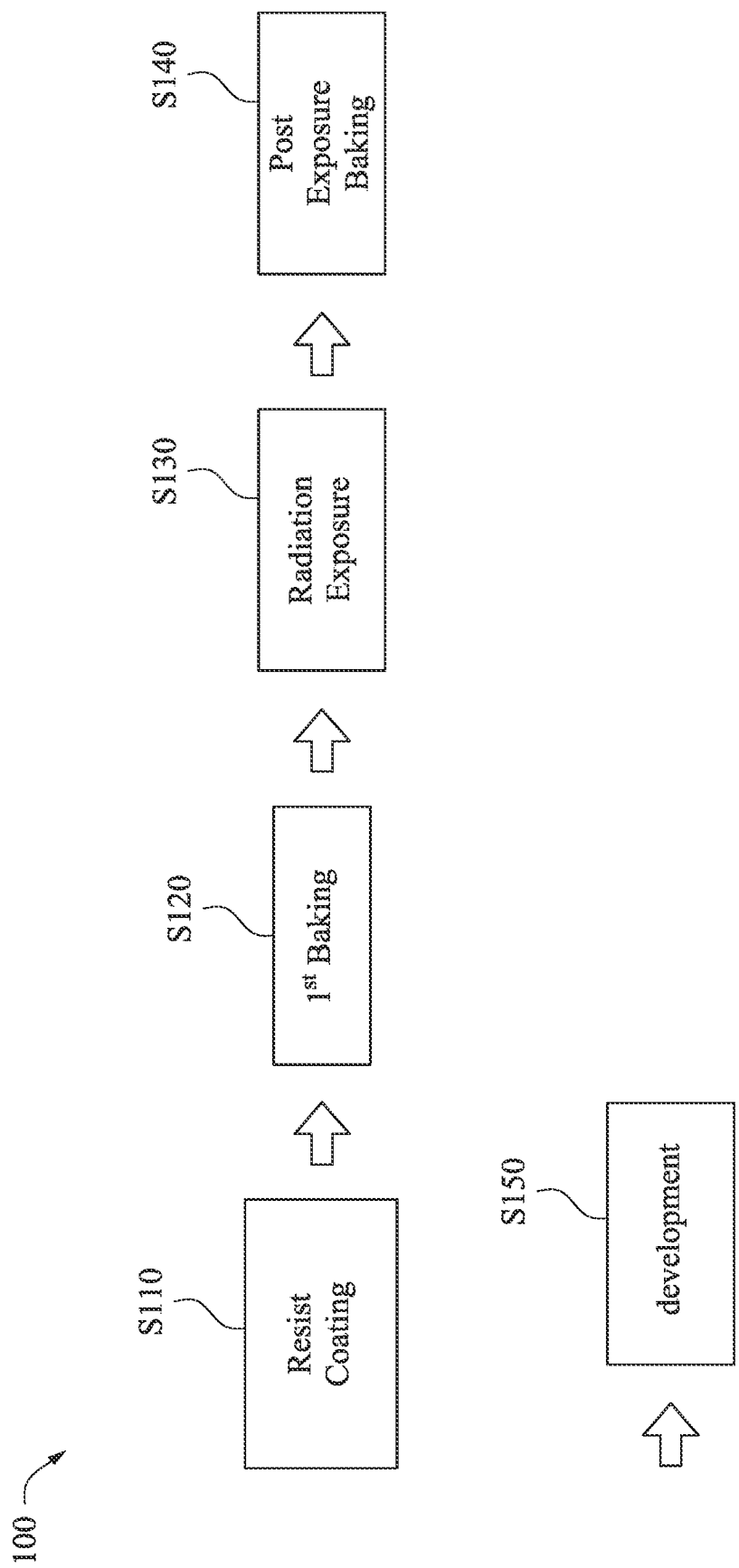
FIG. 1 illustrates a process flow of manufacturing a semiconductor device according to embodiments of the disclosure.
Figure 2:
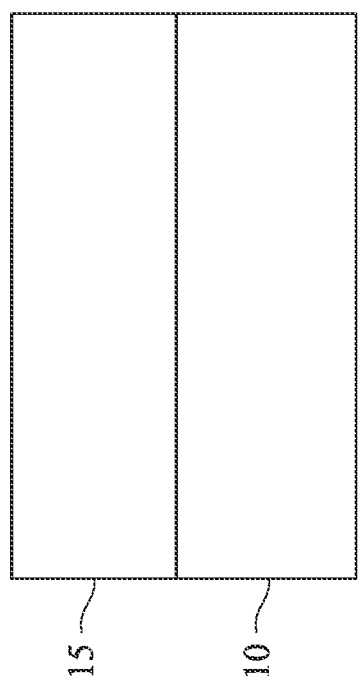
FIG. 2 shows a process stage of a sequential operation according to an embodiment of the disclosure.

FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. Then the resist layer 15 undergoes a first baking operation S120 to evaporate solvents in the resist composition in some embodiments. The resist layer 15 is baked at a temperature and time sufficient to cure and dry the resist layer 15. In some embodiments, the resist layer 15 is heated at a temperature of about 40° C. and 120° C. for about 10 seconds to about 10 minutes.

After the first baking operation S120, the resist layer 15 is selectively exposed to actinic radiation 45 (see FIG. 3) in operation S130. In some embodiments, the resist layer 15 is selectively exposed to ultraviolet radiation. In some embodiments, the ultraviolet radiation is deep ultraviolet radiation. In some embodiments, the ultraviolet radiation is extreme ultraviolet (EUV) radiation. In some embodiments, the radiation is an electron beam.

Figure 3:
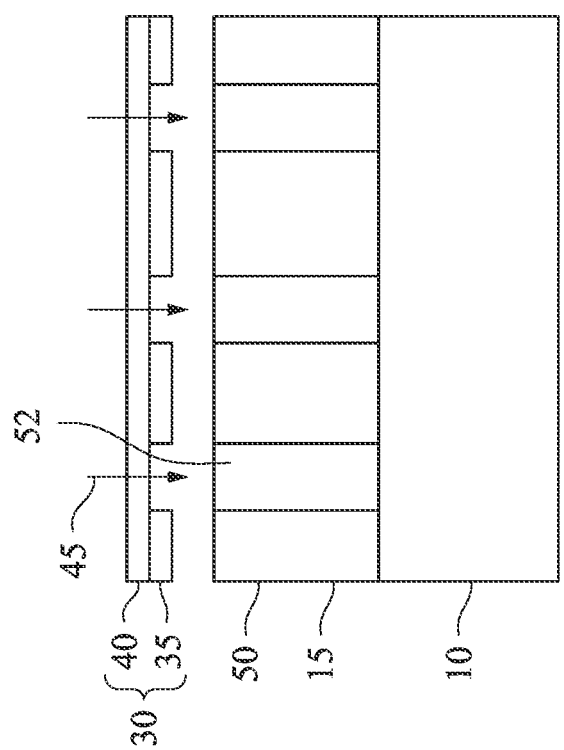
FIG. 3 shows a process stage of a sequential operation according to an embodiment of the disclosure.

As shown in FIG. 3, the exposure radiation 45 passes through a photomask 30 before irradiating the resist layer 15 in some embodiments. In some embodiments, the photomask has a pattern to be replicated in the resist layer 15. The pattern is formed by an opaque pattern 35 on photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the resist layer 15 is a photoresist layer. The region of the photoresist layer 15 exposed to radiation 52 undergoes a chemical reaction thereby changing its solubility in a subsequently applied developer relative to the region of the photoresist layer not exposed to radiation 50. In some embodiments, the portion of the photoresist layer exposed to radiation 52 undergoes a crosslinking reaction.

Next the resist layer 15 undergoes a post-exposure bake (PEB) in operation S140. In some embodiments, the photoresist layer 15 is heated to a temperature of about 50° C. and 250° C. for about 20 seconds to about 300 seconds. The post-exposure baking may be used in order to assist in the generating, dispersing, and reacting of the acid/base/free radical generated from the impingement of the radiation 45 upon the resist layer 15 during the exposure. Such assistance helps to create or enhance chemical reactions which generate chemical differences between the unexposed region 50 and the exposed region 52 within the resist layer. These chemical differences also caused differences in the solubility between the unexposed region 50 and the exposed region 52.

Figure 4:
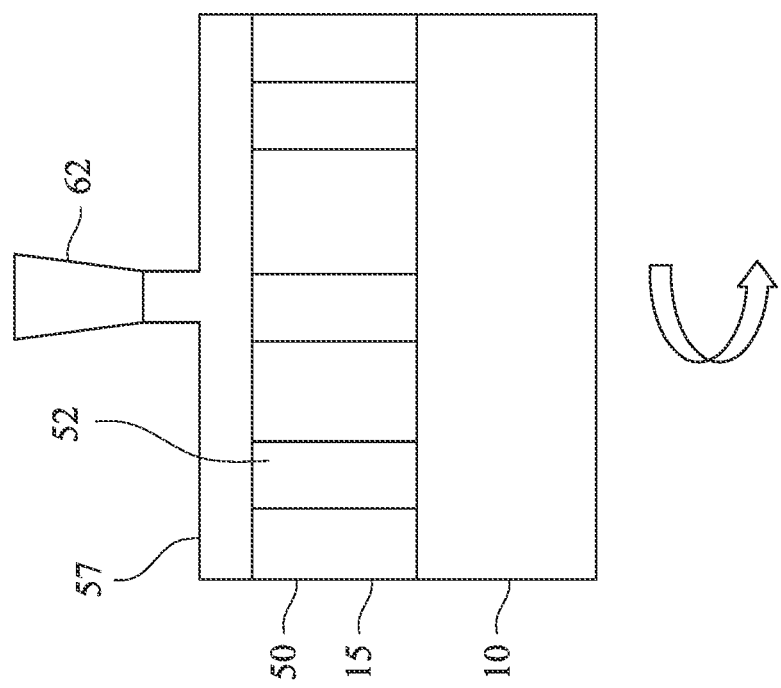
FIG. 4 shows a process stage of a sequential operation according to an embodiment of the disclosure.
Figure 5:
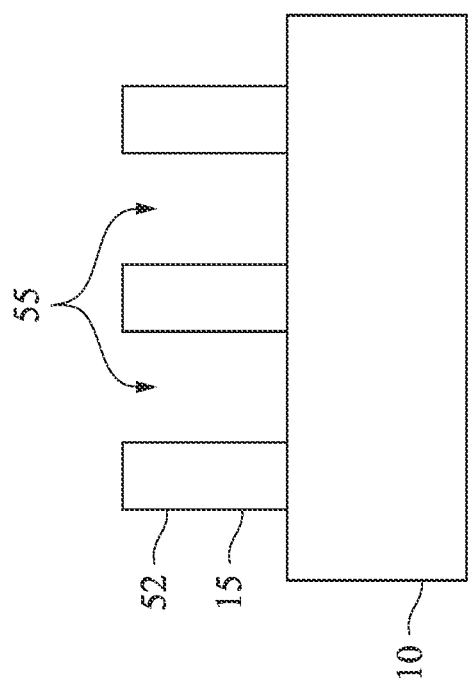
FIG. 5 shows a process stage of a sequential operation according to an embodiment of the disclosure.

The selectively exposed resist layer is subsequently developed by applying a developer to the selectively exposed resist layer in operation S150. As shown in FIG. 4, a developer 57 is supplied from a dispenser 62 to the resist layer 15. In some embodiments, the unexposed region of the resist layer 50 is removed by the developer 57 forming a pattern of openings 55 in the resist layer 15 to expose the substrate 10, as shown in FIG. 5.

Figure 6:
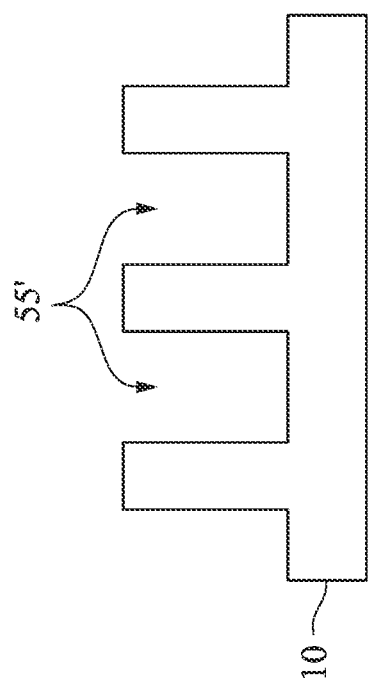
FIG. 6 shows a process stage of a sequential operation according to an embodiment of the disclosure.

In some embodiments, the pattern of openings 55 in the resist layer 15 are extended into the layer to be patterned or substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. The exposed resist layer 15 is at least partially removed during the etching operation in some embodiments. In other embodiments, the exposed resist layer 15 is removed after etching the substrate 10 by using a suitable photoresist stripper solvent or by a photoresist ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least an oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are positive tone resists or negative tone resists. A positive tone resist refers to a photoresist material that when exposed to radiation (typically UV light) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern (i.e.—the exposed regions are removed by the developer) when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development. In some embodiments of the present disclosure, a negative tone photoresist is exposed to actinic radiation. The exposed portions of the negative tone photoresist undergo crosslinking as a result of the exposure to actinic radiation, and during development the unexposed, non-crosslinked portions of the photoresist are removed by the developer leaving the exposed regions of the photoresist remaining on the substrate.

In an embodiment, the photoresist layer 15 is a negative tone photoresist that undergoes a cross-linking reaction upon exposure to the radiation. Photoresists according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclodecane, or the like.

The group which will decompose, otherwise known as a leaving group or, in some embodiments in which the PAC is a photoacid generator, an acid labile group, is attached to the hydrocarbon structure so that it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help improve a variety of properties of the polymerizable resin. For example, inclusion of a lactone group to the hydrocarbon structure assists to reduce the amount of line edge roughness after the photoresist has been developed, thereby helping reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexayl (methacrylate), combinations of these, or the like.

Additionally, some embodiments of the photoresist include one or more photoactive compounds (PACs). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates and diaryliodonium hexafluoroantimonates and hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

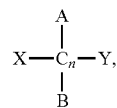

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

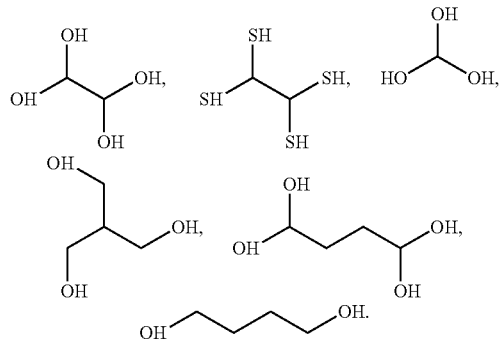

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

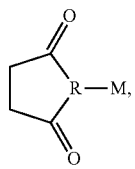

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR, —SO$_2$N(R*)$_2$; —SO$_2$R*; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

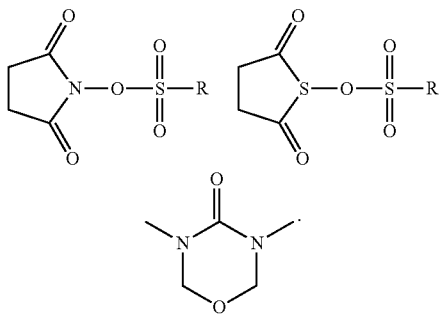

The individual components of the photoresist are placed into a solvent in order to aid in the mixing and dispensing of the photoresist. To aid in the mixing and dispensing of the photoresist, the solvent is chosen at least in part based upon the materials chosen for the polymer as well as the PACs. In some embodiments, the solvent is chosen such that the polymer and the PACs can be evenly dissolved into the solvent and dispensed upon the layer to be patterned.

In some embodiments, the photoresist solvent is an organic solvent, and includes any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the photoresist are merely illustrative and are not intended to limit the embodiments. Rather, any suitable material that dissolves the polymer and the PACs may be used to help mix and apply the photoresist. All such materials are fully intended to be included within the scope of the embodiments.

Additionally, while individual ones of the above described materials may be used as the solvent for the photoresist, in other embodiments more than one of the above described materials are used. For example, in some embodiments, the solvent includes a combination mixture of two or more of the materials described. All such combinations are fully intended to be included within the scope of the embodiments.

In addition to the polymers, the PACs, the solvents, the cross-linking agent, and the coupling reagent, some embodiments of the photoresist also include a number of other additives that assist the photoresist to obtain high resolution. For example, some embodiments of the photoresist also includes surfactants in order to help improve the ability of the photoresist to coat the surface on which it is applied. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in the photoresist composition in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations thereof, or the like.

Another additive added to some embodiments of the photoresist is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent aids observers in examining and finding any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and T-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1- benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxy silane, 3-methacryloyloxypropyltrimethoxysilane, vinyl trimethoxysilane, combinations thereof, or the like.

Metal oxide nanoparticles are added to some embodiments of the photoresist. In some embodiments, the photoresist includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle diameter between 1 and 100 nm.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

Once ready, the photoresist is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-exposure bake of the photoresist layer is performed in some embodiments to cure and dry the photoresist prior to radiation exposure (see FIG. 1). The curing and drying of the photoresist layer 15 removes the solvent component while leaving behind the polymer, the PACs, the cross-linking agent, and the other chosen additives. In some embodiments, the pre-exposure baking is performed at a temperature suitable to evaporate the solvent, such as between about 50° C. and 250° C., although the precise temperature depends upon the materials chosen for the photoresist. The pre-baking is performed for a time sufficient to cure and dry the photoresist layer, such as between about 10 seconds to about 10 minutes.

FIG. 3 illustrates a selective exposure of the photoresist layer to form an exposed region 52 and an unexposed region 50. In some embodiments, the exposure to radiation is carried out by placing the photoresist coated substrate in a photolithography tool. The photolithography tool includes a photomask 30, optics, an exposure radiation source to provide the radiation 45 for exposure, and a movable stage for supporting and moving the substrate under the exposure radiation.

In some embodiments, the radiation source (not shown) supplies radiation 45, such as ultraviolet light, to the photoresist layer 15 in order to induce a reaction of the PACs, which in turn reacts with the polymer to chemically alter those regions of the photoresist layer to which the radiation 45 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45 is patterned by the photomask 30. In some embodiments, the optics include one or more lenses, mirrors, filters, and combinations thereof to control the radiation 45 along its path.

In an embodiment, the patterned radiation 45 is extreme ultraviolet light having a 13.5 nm wavelength, the PAC is a photoacid generator, the group to be decomposed is a carboxylic acid group on the hydrocarbon structure, and a cross linking agent is used. The patterned radiation 45 impinges upon the photoacid generator, the photoacid generator absorbs the impinging patterned radiation 45. This absorption initiates the photoacid generator to generate a proton (e.g., a $H^+$ atom) within the photoresist layer 15. When the proton impacts the carboxylic acid group on the hydrocarbon structure, the proton reacts with the carboxylic acid group, chemically altering the carboxylic acid group and altering the properties of the polymer in general. The carboxylic acid group then reacts with the cross-linking agent to cross-link with other polymers within the exposed region of the photoresist layer 15.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45, a post-exposure baking is performed in some embodiments to assist in the generating, dispersing, and reacting of the acid/base/free radical generated from the impingement of the radiation 45 upon the PACs during the exposure. Such thermal assistance helps to create or enhance chemical reactions, which generate chemical differences between the exposed region 52 and the unexposed region 5 within the photoresist layer 15. These chemical differences also cause differences in the solubility between the exposed region 52 and the unexposed region 50. In some embodiments, the post-exposure baking occurs at temperatures ranging from about 50° C. to about 250° C. for a period of between about 20 seconds and about 300 seconds.

The inclusion of the cross-linking agent into the chemical reactions helps the components of the polymer (e.g., the individual polymers) react and bond with each other, increasing the molecular weight of the bonded polymer in some embodiments. In particular, an initial polymer has a side chain with a carboxylic acid protected by one of the groups to be removed/acid labile groups. The groups to be removed are removed in a de-protecting reaction, which is initiated by a proton H+ generated by, e.g., the photoacid generator during either the exposure process or during the post-exposure baking process. The H+ first removes the groups to be removed/acid labile groups and another hydrogen atom may replace the removed structure to form a de-protected polymer. Once de-protected, a cross-linking reaction occurs between two separate de-protected polymers that have undergone the de-protecting reaction and the cross-linking agent in a cross-linking reaction. In particular, hydrogen atoms within the carboxylic groups formed by the de-protecting reaction are removed and the oxygen atoms react with and bond with the cross-linking agent. This bonding of the cross-linking agent to two polymers bonds the two polymers not only to the cross-linking agent but also bonds the two polymers to each other through the cross-linking agent, thereby forming a cross-linked polymer.

By increasing the molecular weight of the polymers through the cross-linking reaction, the new cross-linked polymer becomes less soluble in negative tone resist developers.

In some embodiments, the photoresist developer composition 57 includes a first solvent, an acid or a base, and second solvent having a dielectric constant greater than 18. The first solvent and the second solvent are different solvents in some embodiments. In some embodiments, the concentration of the first solvent is from about 60 wt. % to about 99 wt. % based on the total weight of the photoresist developer composition. The acid or base concentration is from about 0.001 wt. % to about 20 wt. % based on the total weight of the photoresist developer composition. In certain embodiments, the acid or base concentration in the developer is from about 0.01 wt. % to about 15 wt. % based on the total weight of the photoresist developer composition. In certain embodiments, the second solvent concentration in the developer is from about 1 wt. % to about 40 wt. % based on the total weight of the photoresist developer composition. At concentrations of the solvent components outsided the disclosed ranges, developer composition performance and development efficiency may be reduced, leading to increased photoresist residue and scum in the photoresist pattern, and increased line width roughness and line edge roughness.

In some embodiments, the first solvent has Hansen solubility parameters of $15<\delta_d<25$, $10<\delta_p<25$, and $6<\delta_h<30$. The units of the Hansen solubility parameters are $(Joules/cm^3)^{1/2}$ or, equivalently, $MPa^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other.

First solvents having the desired Hansen solubility parameters include hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water.

In some embodiments, the acid has an acid dissociation constant, $pK_a$, of $-15<pK_a<5$. In some embodiments, the base has a $pK_a$ of $40>pK_a>9.5$. The acid dissociation constant, $pK_a$, is the logarithmic constant of the acid dissociation constant $K_a$. $K_a$ is a quantitative measure of the strength of an acid in solution. $K_a$ is the equilibrium constant for the dissociation of a generic acid according to the equation $HA+H_2O\leftrightarrow A^-+H_3O^+$, where HA dissociates into its conjugate base, $A^-$, and a hydrogen ion which combines with a water molecule to form a hydronium ion. The dissociation constant can be expressed as a ratio of the equilibrium concentrations:

$$K_a = \frac{[A^-][H_3O^+]}{[HA][H_2O]}.$$

In most cases, the amount of water is constant and the equation can be simplified to $HA\leftrightarrow A^-+H^+$, and $$K_a = \frac{[A^-][H^+]}{[HA]}.$$

The logarithmic constant, $pK_a$ is related to $K_a$ by the equation $pK_a=-\log_{10}(K_a)$. The lower the value of $pK_a$ the stronger the acid. Conversely, the higher the value of $pK_a$ the stronger the base.

In some embodiments, suitable acids for the photoresist developer composition 57 include an organic acid selected from the group consisting of formic acid, acetic acid, ethanedioic acid, 2-hydroxyethanoic acid, oxoethanoic acid, propanoic acid, propanedioic acid, 2-hydroxypropanoic acid, butanoic acid, 2-hydroxybutanedioic acid, butanedioic acid, 3-oxobutanoic acid, pentanoic acid, hexanoic acid, heptanoic acid, caprylic acid, citric acid, uric acid, trifluoromethanesulfonic acid, benzenesulfonic acid, ethanesulfonic acid, methanesulfonic acid, oxalic acid, maleic acid, carbonic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, and combinations thereof. In some embodiments, the acid is an inorganic acid selected from the group consisting of nitric acid, sulfuric acid, hydrochloric acid, and combinations thereof.

In some embodiments, suitable bases for the photoresist developer composition 57 include an alkanolamine, a triazole, or an ammonium compound. In some embodiments, suitable bases include an organic base selected from the group consisting of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, and tetrabutylammonium hydroxide, and combinations thereof; or inorganic bases selected from the group consisting of ammonium hydroxide, ammonium sulfamate, ammonium carbamate, and combinations thereof. In some embodiments, the base is selected from the group consisting of monoisopropanolamine, 2-amino-2-methyl-1-propanol, 1H-benzotriazole, 1,2,4-triazole, 1,8-diazabicycloundec-7-ene, and combinations thereof. In some embodiments, the second solvent having a dielectric constant greater than 18 includes water, methanol, ethanol, n-propanol, n-butanol, formic acid, formamide, acetone, methyl ethyl ketone, acetonitrile, dimethyl formamide, and dimethyl sulfoxide, or the like. In some embodiment, the concentration of the second solvent is from about 1 wt. % to about 40 wt. % based on the total weight of the developer. In some embodiments, the second solvent is deionized water.

In some embodiments, the developer is mixture of propylene glycol methyl ether, deionized water, and formic acid. In other embodiments, the developer is a mixture of propylene glycol methyl ether, deionized water, and acetic acid. And in other embodiments, the developer is a mixture of propylene glycol methyl ether acetate, deionized water, and formic acid.

In some embodiments, the photoresist developer includes a chelate. In some embodiments, the chelate is selected from the group consisting of ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine, and combinations thereof, or the like. In some embodiments, the chelate concentration is from about 0.001 wt. % to about 20 wt. % of the total weight of the photoresist developer.

In some embodiments, the photoresist developer composition 57 includes hydrogen peroxide in a concentration of up to about 10 wt. % based on the total weight of the developer.

In some embodiments, the photoresist developer composition 57 includes up to about 1 wt. % of a surfactant to increase the solubility and reduce the surface tension on the substrate. In some embodiments, the photoresist developer surfactant is selected from the group consisting of alkylbenzenesulfonates, lignin sulfonates, fatty alcohol ethoxylates, and alkylphenol ethoxylates. In some embodiments, the surfactant is selected from the group consisting of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl) dimethylammonio]-1-propanesulfonate, cocamidopropyl hydroxysultaine, cocamidopropyl betaine, phospholipids-phosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, sorbitan tristearate, and combinations thereof.

In some embodiments, the developer 57 is applied to the photoresist layer 15 using a spin-on process. In the spin-on process, the developer 57 is applied to the photoresist layer 15 from above the photoresist layer 15 while the photoresist coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. during the development operation. The development operation continues for between about 10 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer composition 57 dissolves the photoresist regions 50 not exposed to radiation (i.e.—not crosslinked), exposing the surface of the substrate 10, as shown in FIG. 5, and leaving behind well-defined exposed photoresist regions 52, having improved definition than provided by conventional negative tone photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 52 is in place. For example, an etching operation, using dry or wet etching, is performed in some embodiments, to transfer the pattern of the photoresist layer 52 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 7:
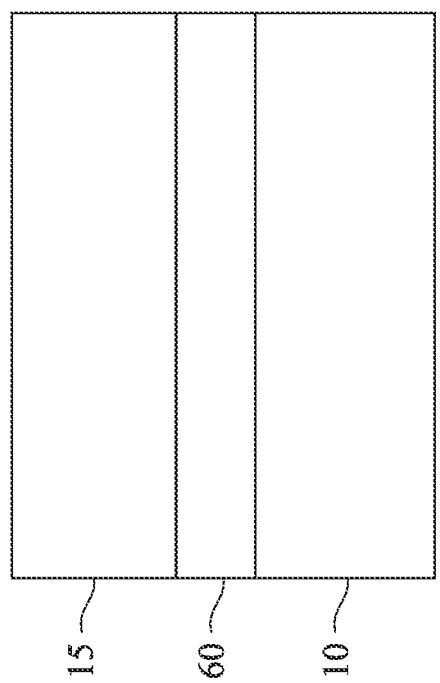
FIG. 7 shows a process stage of a sequential operation according to an embodiment of the disclosure.

In some embodiments, a layer to be patterned 60 is disposed over the substrate prior to forming the photoresist layer, as shown in FIG. 7. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 8:
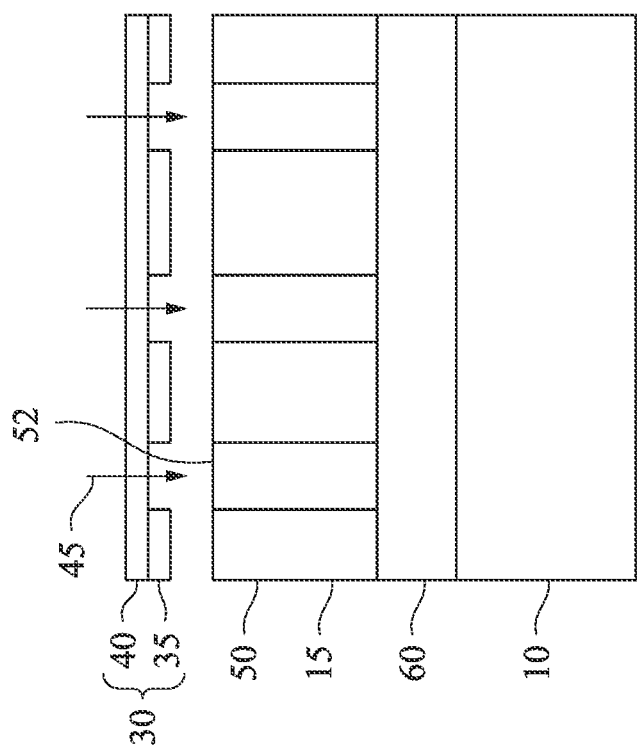
FIG. 8 shows a process stage of a sequential operation according to an embodiment of the disclosure.

The photoresist layer 15 is subsequently selectively exposed to actinic radiation 45 to form exposed regions 52 and unexposed regions 50 in the photoresist layer, as shown in FIG. 8, and described herein in relation to FIG. 3. As explained herein the photoresist is a negative photoresist, wherein polymer crosslinking occurs in the exposed regions 52 in some embodiments.

Figure 9:
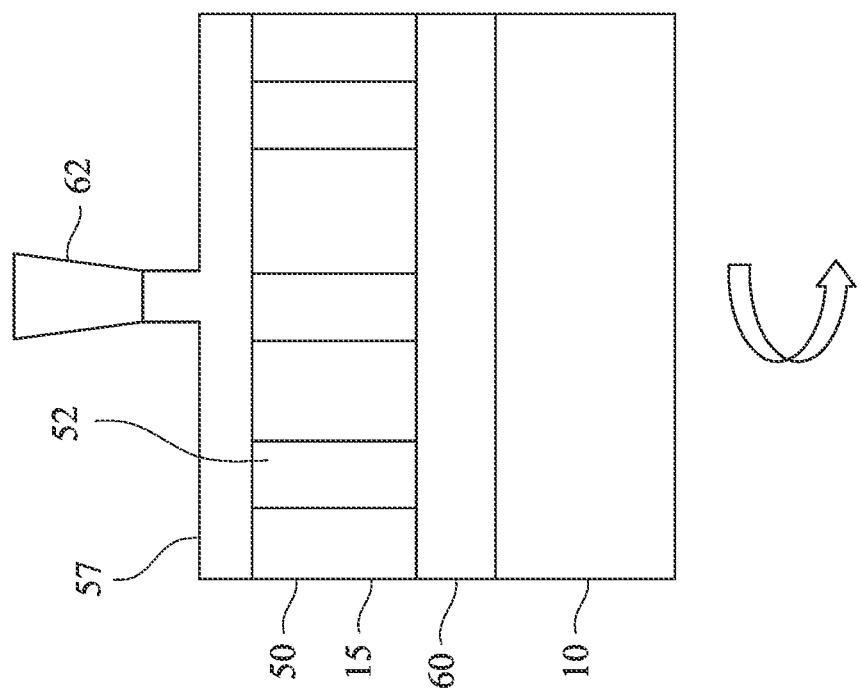
FIG. 9 shows a process stage of a sequential operation according to an embodiment of the disclosure.

As shown in FIG. 9, the unexposed photoresist regions 50 are developed by dispensing developer 57 from a dispenser 62 to form a pattern of photoresist openings 55, as shown in FIG. 10. The development operation is similar to that explained with reference to FIGS. 4 and 5, herein.

Then as shown in FIG. 11, the pattern 55 in the photoresist layer 15 is transferred to the layer to be patterned 60 using an etching operation and the photoresist layer is removed, as explained with reference to FIG. 6 to form pattern 55' in the layer to be patterned 60.

Figure 12:
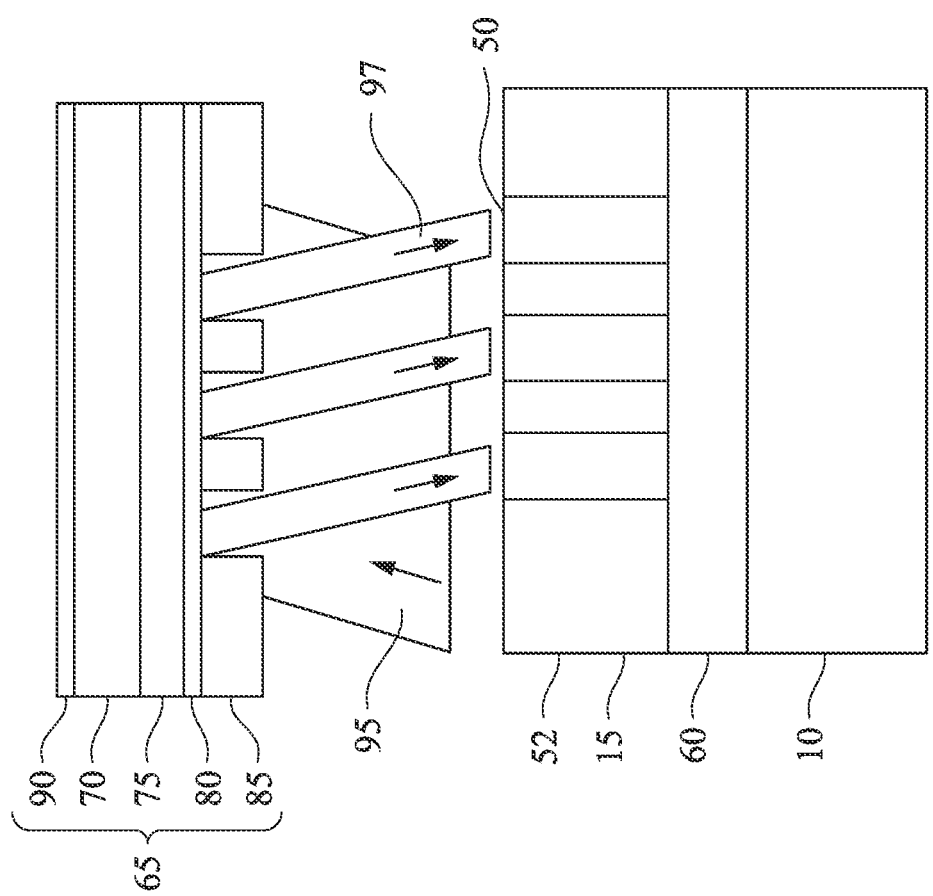
FIG. 12 shows a process stage of a sequential operation according to an embodiment of the disclosure.

In some embodiments, the selective exposure of the photoresist layer 15 to form unexposed regions 50 and exposed regions 52 is performed using extreme ultraviolet lithography. In an extreme ultraviolet lithography operation a reflective photomask 65 is used to form the patterned exposure light, as shown in FIG. 12. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber 85 is absorbed by the photomask. In some embodiments, additional optics, including mirrors are between the reflective photomask 65 and the photoresist coated substrate.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

The novel photoresist developer compositions and negative photoresist photolithography techniques according to the present disclosure provide higher semiconductor device feature density with reduced defects in a higher efficiency process than conventional developers and techniques. The novel photoresist developer compositions and negative photoresist photolithography techniques according to the present disclosure provide improved removal of residue and scum from the developed photoresist pattern. The high dielectric constant (>18) solvent assists the dissociation of the acid or base to accelerate the removal of photoresist residue and scum in some embodiments.

An embodiment of the disclosure is a method of forming a pattern in a photoresist, including forming a photoresist layer over a substrate, and selectively exposing the photoresist layer to actinic radiation to form a latent pattern. The latent pattern is developed by applying a developer composition to the selectively exposed photoresist layer to form a pattern. The developer composition includes a first solvent having Hansen solubility parameters of $15<\delta_d<25$, $10<\delta_p<25$, and $6<\delta_h<30$; an acid having an acid dissociation constant, pKa, of $-15<pKa<5$, or a base having a pKa of $40>pKa>9.5$; and a second solvent having a dielectric constant greater than 18. The first solvent and the second solvent are different solvents. In an embodiment, a concentration of the first solvent ranges from 60 wt. % to 99 wt. % based on a total weight of the developer composition. In an embodiment, a concentration of the acid or base ranges from 0.001 wt. % to 20 wt. % based on a total weight of the developer composition. In an embodiment, a concentration of the second solvent ranges from 1 wt. % to 40 wt. % based on a total weight of the developer composition. In an embodiment, the first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water. In an embodiment, the second solvent is at least one of methanol, ethanol, n-propanol, n-butanol, formic acid, formamide, acetone, methyl ethyl ketone, acetonitrile, dimethyl formamide, dimethyl sulfoxide, or water. In an embodiment, the developer composition includes the acid, and the acid is at least one of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, nitric acid, sulfuric acid, or hydrochloric acid. In an embodiment, the base is at least one of an alkanolamine, a triazole, or an ammonium compound. In an embodiment, the developer composition includes the base, and the base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide, ammonium hydroxide, ammonium sulfamate, or ammonium carbamate. In an embodiment, the method includes heating the photoresist layer after selectively exposing the photoresist layer to actinic radiation and before developing the photoresist layer. In an embodiment, the developer composition is at a temperature of about 25° C. to about 75° C. during the developing. In an embodiment, the method includes heating the photoresist layer before selectively exposing the photoresist layer to actinic radiation. In an embodiment, the developer composition includes a surfactant. In an embodiment, a concentration of the surfactant is from 0.001 wt. % to 1 wt. % based on a total weight of the developer composition.

Another embodiment of the disclosure is a method including forming a resist layer over a substrate. The resist layer is patternwise crosslinked to form a latent pattern in the resist layer including a crosslinked portion and an uncrosslinked portion of the resist layer. The latent pattern is developed by applying a developer composition to remove the uncrosslinked portion of the resist layer to form a pattern of the crosslinked portion of the resist layer. The developer composition includes a first solvent having Hansen solubility parameters of $15<\delta_d<25$, $10<\delta_p<25$, and $6<\delta_h<30$; an acid having an acid dissociation constant, pKa, of $-15<pKa<5$, or a base having a pKa of $40>pKa>9.5$; and a second solvent having a dielectric constant greater than 18. The first solvent and second solvent are different solvents. In an embodiment, the method includes heating the resist layer after selectively exposing the resist layer to actinic radiation and before developing the resist layer. In an embodiment, the first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water. In an embodiment, the second solvent is at least one of methanol, ethanol, n-propanol, n-butanol, formic acid, formamide, acetone, methyl ethyl ketone, acetonitrile, dimethyl formamide, dimethyl sulfoxide, or water. In an embodiment, the developer composition includes the acid, and the acid is at least one of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, nitric acid, sulfuric acid, or hydrochloric acid. In an embodiment, the developer composition includes the base, and the base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide, ammonium hydroxide, ammonium sulfamate, or ammonium carbamate. In an embodiment, a concentration of the first solvent ranges from 60 wt. % to 99 wt. % based on a total weight of the developer composition. In an embodiment, a concentration of the acid or base ranges from 0.001 wt. % to 20 wt. % based on a total weight of the developer composition. In an embodiment, a concentration of the second solvent ranges from 1 wt. % to 40 wt. % based on a total weight of the developer composition. In an embodiment, the developer composition is at a temperature of about 25° C. to about 75° C. during the developing. In an embodiment, the method includes heating the resist layer before patternwise crosslinking the resist layer. In an embodiment, the developer composition includes from 0.001 wt. % to 1 wt. % of a surfactant based on a total weight of the developer composition.

Another embodiment of the disclosure is a photoresist developer composition, including a first solvent having Hansen solubility parameters of $15<\delta_d<25$, $10<\delta_p<25$, and $6<\delta_h<30$; an acid having an acid dissociation constant, pKa, of $-15<pKa<5$, or a base having a pKa of $40>pKa>9.5$; and a second solvent having a dielectric constant greater than 18. The first solvent and the second solvent are different solvents. In an embodiment, the first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water. In an embodiment, the second solvent is at least one of methanol, ethanol, n-propanol, n-butanol, formic acid, formamide, acetone, methyl ethyl ketone, acetonitrile, dimethyl formamide, dimethyl sulfoxide, or water. In an embodiment, the developer composition includes the acid, and the acid is at least one of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, nitric acid, sulfuric acid, or hydrochloric acid. In an embodiment, the developer composition includes the base, and the base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide, ammonium hydroxide, ammonium sulfamate, or ammonium carbamate. In an embodiment, a concentration of the first solvent is from 60 wt. % to 99 wt. % based on a total weight of the photoresist developer composition. In an embodiment, a concentration of the acid or base is from 0.001 wt. % to 20 wt. % based on a total weight of the photoresist developer composition. In an embodiment, a concentration of the second solvent is from 1 wt. % to 40 wt. % based on a total weight of the photoresist developer composition. In an embodiment, the photoresist developer composition includes a surfactant. In an embodiment, a concentration of the surfactant is from 0.001 wt. % to 1 wt. % based on a total weight of the photoresist developer composition.

Another embodiment of the disclosure is a method of patterning a photoresist layer including forming a negative tone photoresist layer over a substrate. The photoresist layer is selectively exposed to actinic radiation to form a latent pattern. Portions of the photoresist layer not exposed to the actinic radiation are removed by applying a developer composition to the selectively exposed photoresist layer to form a pattern. The developer composition includes a first solvent, a second solvent, and an organic acid or an organic base. The first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water. The organic acid is at least one of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, or 5-sulfosalicylic acid. The organic base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide. The second solvent is at least one of methanol, ethanol, n-propanol, n-butanol, formic acid, formamide, acetone, methyl ethyl ketone, acetonitrile, dimethyl formamide, dimethyl sulfoxide, or water. The first solvent and second solvent are different solvents. In an embodiment, a concentration of the first solvent ranges from 60 wt. % to 99 wt. % based on a total weight of the developer composition. In an embodiment, a concentration of the acid or base ranges from 0.001 wt. % to 20 wt. % based on a total weight of the developer composition. In an embodiment, a concentration of the second solvent ranges from 1 wt. % to 40 wt. % based on a total weight of the developer composition. In an embodiment, the method includes heating the photoresist layer after selectively exposing the photoresist layer to actinic radiation and before removing portions of the photoresist layer. In an embodiment, the developer composition includes a surfactant. In an embodiment, a concentration of the surfactant is from 0.001 wt. % to 1 wt. % based on a total weight of the developer composition. In an embodiment, the developer composition is at a temperature of 25° C. to 75° C. during the developing. In an embodiment, the method includes heating the photoresist layer before selectively exposing the photoresist layer to actinic radiation.

Another embodiment of the disclosure is a photoresist developer composition including a first solvent, a second solvent, and an organic acid or an organic base. The first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water. The organic acid is at least one of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, or 5-sulfosalicylic acid. The organic base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide. The second solvent is at least one of methanol, ethanol, n-propanol, n-butanol, formic acid, formamide, acetone, methyl ethyl ketone, acetonitrile, dimethyl formamide, dimethyl sulfoxide, or water. The first solvent and second solvent are different solvents. In an embodiment, a concentration of the first solvent ranges from 60 wt. % to 99 wt. % based on a total weight of the developer composition. In an embodiment, a concentration of the acid or base ranges from 0.001 wt. % to 20 wt. % based on a total weight of the developer composition. In an embodiment, a concentration of the second solvent ranges from 1 wt. % to 40 wt. % based on a total weight of the developer composition. In an embodiment, the developer composition includes a surfactant. In an embodiment, the surfactant is at least one of alkylbenzenesulfonates, lignin sulfonates, fatty alcohol ethoxylates, or alkylphenol ethoxylates. In an embodiment, the surfactant is at least one of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl)dimethylammonio]-1-propanesulfonate, cocamidopropyl hydroxysultaine, cocamidopropyl betaine, phospholipids-phosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, or sorbitan tristearate. In an embodiment, a concentration of the surfactant is from 0.001 wt. % to 1 wt. % based on a total weight of the developer composition.

Another embodiment of the disclosure is a photoresist developer composition including a first solvent, a second solvent, and an inorganic acid or an inorganic base. The first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water. The inorganic acid is at least one of nitric acid, sulfuric acid, or hydrochloric acid. The inorganic base is at least one of ammonium hydroxide, ammonium sulfamate, or ammonium carbamate. The second solvent is at least one of methanol, ethanol, n-propanol, n-butanol, formic acid, formamide, acetone, methyl ethyl ketone, acetonitrile, dimethyl formamide, dimethyl sulfoxide, or water. The first solvent and second solvent are different solvents. In an embodiment, a concentration of the first solvent ranges from 60 wt. % to 99 wt. % based on a total weight of the developer composition. In an embodiment, a concentration of the acid or base ranges from 0.001 wt. % to 20 wt. % based on a total weight of the developer composition. In an embodiment, a concentration of the second solvent ranges from 1 wt. % to 40 wt. % based on a total weight of the developer composition. In an embodiment, the developer composition includes a surfactant. In an embodiment, the surfactant is at least one of alkylbenzenesulfonates, lignin sulfonates, fatty alcohol ethoxylates, or alkylphenol ethoxylates. In an embodiment, the surfactant is at least one of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl)dimethylammonio]-1-propanesulfonate, cocamidopropyl hydroxysultaine, cocamidopropyl betaine, phospholipids-phosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, or sorbitan tristearate. In an embodiment, a concentration of the surfactant is from 0.001 wt. % to 1 wt. % based on a total weight of the developer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a photoresist layer, comprising:
   forming a negative tone photoresist layer over a substrate;
   selectively exposing the photoresist layer to actinic radiation to form a latent pattern; and
   removing portions of the photoresist layer not exposed to the actinic radiation by applying a developer composition to the selectively exposed photoresist layer to form a pattern,
   wherein the developer composition comprises:
   a first solvent, a second solvent, a surfactant, and an organic acid or an organic base,
   wherein the first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water;
   the organic acid is at least one of ethanedioic acid, formic acid, acetic acid, propanoic acid, 2-hydroxypropanoic acid, butanoic acid, 2-hydroxybutanedioic acid, pentanoic acid, hexanoic acid, heptanoic acid, caprylic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, or 5-sulfosalicylic acid;
   the organic base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide;
   the second solvent is at least one of methanol, ethanol, n-propanol, n-butanol, formic acid, formamide, acetone, methyl ethyl ketone, acetonitrile, dimethyl formamide, dimethyl sulfoxide, or water; and
   the first solvent and second solvent are different solvents.

2. The method according to claim 1, wherein a concentration of the first solvent ranges from 60 wt. % to 99 wt. % based on a total weight of the developer composition.

3. The method according to claim 1, wherein a concentration of the acid or base ranges from 0.001 wt. % to 20 wt. % based on a total weight of the developer composition.

4. The method according to claim 1, wherein a concentration of the second solvent ranges from 1 wt. % to 40 wt. % based on a total weight of the developer composition.

5. The method according to claim 1, further comprising heating the photoresist layer after selectively exposing the photoresist layer to actinic radiation and before removing portions of the photoresist layer.

6. The method according to claim 1, wherein a concentration of the surfactant is from 0.001 wt. % to 1 wt. % based on a total weight of the developer composition.

7. The method according to claim 1, wherein the developer composition is at a temperature of 25° C. to 75° C. during the developing.

8. A photoresist developer composition, comprising:
   a first solvent, a second solvent, a surfactant, and an organic acid or an organic base,
   wherein the first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water;
   the organic acid is at least one of ethanedioic acid, formic acid, acetic acid, propanoic acid, 2-hydroxypropanoic acid, butanoic acid, 2-hydroxybutanedioic acid, pentanoic acid, hexanoic acid, heptanoic acid, caprylic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, or 5-sulfosalicylic acid;

the organic base is at least one of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, tetrabutylammonium hydroxide;

the second solvent is at least one of methanol, ethanol, n-propanol, n-butanol, formic acid, formamide, acetone, methyl ethyl ketone, acetonitrile, dimethyl formamide, dimethyl sulfoxide, or water; and the first solvent and second solvent are different solvents.

9. The photoresist developer composition of claim 8, wherein a concentration of the first solvent ranges from 60 wt. % to 99 wt. % based on a total weight of the developer composition.

10. The photoresist developer composition of claim 8, wherein a concentration of the acid or base ranges from 0.001 wt. % to 20 wt. % based on a total weight of the developer composition.

11. The photoresist developer composition of claim 8, wherein a concentration of the second solvent ranges from 1 wt. % to 40 wt. % based on a total weight of the developer composition.

12. The photoresist developer composition of claim 8, wherein the surfactant is at least one of alkylbenzenesulfonates, lignin sulfonates, fatty alcohol ethoxylates, or alkylphenol ethoxylates.

13. The photoresist developer composition of claim 12, wherein the surfactant is at least one of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl)dimethylammonio]-1-propanesulfonate, cocamidopropyl hydroxysultaine, cocamidopropyl betaine, phospholipidsphosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, or sorbitan tristearate.

14. The photoresist developer composition of claim 8, wherein a concentration of the surfactant is from 0.001 wt. % to 1 wt. % based on a total weight of the developer composition.

15. A photoresist developer composition, comprising:
a first solvent, a second solvent, a surfactant, and an inorganic acid or an inorganic base,
wherein the first solvent is at least one of hexane, benzene, dimethyl sulfoxide, acetone, ethylene glycol, methanol, ethanol, propanol, isopropanol, propanediol, 4-methyl-2-pentanone, butyldiglycol, ethyl acetate, butyl acetate, propylene glycol methyl ether acetate, propylene glycol methyl ether, diethyl ether, isobutyl propionate, tetrahydrofuran, hydrogen peroxide, or water;
the inorganic acid is at least one of nitric acid, sulfuric acid, or hydrochloric acid;
the inorganic base is at least one of ammonium hydroxide, ammonium sulfamate, or ammonium carbamate; and
the second solvent is at least one of methanol, ethanol, n-propanol, n-butanol, formic acid, formamide, acetone, methyl ethyl ketone, acetonitrile, dimethyl formamide, dimethyl sulfoxide, or water; and
the first solvent and second solvent are different solvents.

16. The photoresist developer composition of claim 15, wherein a concentration of the first solvent ranges from 60 wt. % to 99 wt. % based on a total weight of the developer composition.

17. The photoresist developer composition of claim 15, wherein a concentration of the acid or base ranges from 0.001 wt. % to 20 wt. % based on a total weight of the developer composition.

18. The photoresist developer composition of claim 15, wherein a concentration of the second solvent ranges from 1 wt. % to 40 wt. % based on a total weight of the developer composition.

19. The photoresist developer composition of claim 15, wherein the surfactant is at least one selected from the group consisting of alkylbenzenesulfonates, lignin sulfonates, fatty alcohol ethoxylates, alkylphenol ethoxylates, sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl)dimethylammonio]-1-propanesulfonate, cocamidopropyl hydroxysultaine, cocamidopropyl betaine, phospholipidsphosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, and sorbitan tristearate.

20. The photoresist developer composition of claim 15, wherein a concentration of the surfactant is from 0.001 wt. % to 1 wt. % based on a total weight of the developer composition.

* * * * *